(12) United States Patent
Wu et al.

(10) Patent No.: US 9,653,513 B1
(45) Date of Patent: May 16, 2017

(54) CMOS IMAGE SENSOR AND A METHOD OF FORMING THE SAME

(71) Applicant: Himax Imaging Limited, Tainan (TW)

(72) Inventors: Yang Wu, Tainan (TW); Inna Patrick, Tainan (TW); Desmond Cheung, Tainan (TW); Kihong Kim, Tainan (TW); Feixia Yu, Tainan (TW)

(73) Assignee: Himax Imaging Limited, Tainan (TW)

( * ) Notice: Subject to any disclaimer, the term of this patent is extended or adjusted under 35 U.S.C. 154(b) by 0 days.

(21) Appl. No.: 15/094,888

(22) Filed: Apr. 8, 2016

(51) Int. Cl.
*H01L 27/146* (2006.01)
*H01L 21/00* (2006.01)
*H01L 27/148* (2006.01)

(52) U.S. Cl.
CPC .. *H01L 27/14654* (2013.01); *H01L 27/14672* (2013.01); *H01L 27/14887* (2013.01)

(58) Field of Classification Search
CPC ............... H01L 27/14654; H01L 27/14672
USPC .............................. 438/75–79; 257/444–447
See application file for complete search history.

(56) References Cited

U.S. PATENT DOCUMENTS

| | | | | |
|---|---|---|---|---|
| 6,657,665 B1 * | 12/2003 | Guidash | ............ | H01L 27/14603 348/308 |
| 7,443,437 B2 * | 10/2008 | Altice, Jr. | .............. | H04N 5/363 348/296 |
| 8,575,531 B2 * | 11/2013 | Hynecek | ............. | H01L 27/1464 250/208.1 |
| 8,698,061 B2 * | 4/2014 | Krymski | ........... | H01L 27/14689 250/208.1 |
| 9,369,648 B2 * | 6/2016 | Hynecek | ........... | H01L 27/14614 348/294 |

* cited by examiner

*Primary Examiner* — Calvin Lee
(74) *Attorney, Agent, or Firm* — Donald E. Stout; Stout, Uxa & Buyan, LLP

(57) ABSTRACT

A complementary metal-oxide-semiconductor (CMOS) image sensor includes an implant region of a second type formed in a crystalline layer of a first type. A channel of a transfer gate entirely covers the implant region, which partially joins a photodiode, a doped well and a floating diffusion node.

9 Claims, 12 Drawing Sheets

CMOS IMAGE SENSOR AND A METHOD OF FORMING THE SAME

BACKGROUND OF THE INVENTION

1. Field of the Invention

The present invention generally relates to a CMOS image sensor, and more particularly to a CMOS image sensor capable of improving anti-blooming and/or charge transfer.

2. Description of Related Art

A complementary metal-oxide-semiconductor (CMOS) image sensor has been widely applied to mobile applications. The CMOS image sensor may be applied to other applications such as automotive and security. Requirements for the automotive and security applications are quite different from that for the mobile applications. For example, blooming is highly undesirable in automotive and surveillance application. Blooming happens when a pixel is filled up with photo carriers and can no longer collect more electron/hole pairs during pixel exposure. A bright pixel will spreads to several other pixels in the neighboring region.

The road scene, especially at night, has a high dynamic range. The CMOS image sensor is thus required to have a good blooming control at ultra-bright region in order to ensure that the neighboring dimly lit regions are not washed out by the blooming charges. Otherwise, many details get lost and it is difficult to extract the information from the scene. Moreover, at high temperature operation such as in a car, a hot pixel could be filled up by dark current even in the dark. The adjacent good pixels will become hot by receiving the blooming charges.

Charge transfer is another requirement for the automotive and security applications. Pixel charge transfer speed is a key component of data bandwidth of the CMOS image sensor. If charge transfer is not complete, it will be manifested as undesirable dark/low light noise, which limits the minimum acceptable light level of the image sensor.

For the reason that conventional CMOS image sensors could not effectively solve blooming and charge transfer problems, a need has thus arisen to propose a novel CMOS image sensor with improved anti-blooming and charge transfer.

SUMMARY OF THE INVENTION

In view of the foregoing, it is an object of the embodiment of the present invention to provide a CMOS image sensor that is capable of improving anti-blooming and/or charge transfer.

According to one embodiment, a CMOS image sensor includes a substrate, a crystalline layer of a first type, a photodiode, at least one doped well, a transfer gate, a floating diffusion node and an implant region. The crystalline layer is formed on the substrate. The implant region, the photodiode and the doped well are formed in the crystalline layer, and the floating diffusion node is positioned in the doped well. The transfer gate is formed on a top surface of the crystalline layer, and a channel of the transfer gate entirely covers the implant region. The transfer gate partially covers an edge of photodiode and an edge of the doped well. The implant region partially joins the photodiode, the doped well and the floating diffusion node.

According to another embodiment, a method of forming a CMOS image sensor includes the following steps. A substrate is provided, and a crystalline layer of a first type is formed on the substrate. An implant region of a second type is formed in the crystalline layer. At least one doped well of the first type is formed in the crystalline layer, and the implant region partially joins the doped well. A transfer gate is formed on a top surface of the crystalline layer, the transfer gate partially covers an edge of the doped well, and the implant region is entirely covered by a channel of the transfer gate. A photodiode is formed in the crystalline layer, and the implant region partially joins the photodiode. Source/drain implant is performed to result in a floating diffusion node positioned in the doped well, and the implant region partially joins the floating diffusion node.

BRIEF DESCRIPTION OF THE DRAWINGS

FIG. 4B shows a potential diagram of FIG. 4A along line 104 during charge transfer when the transfer gate is turned on;

FIG. 5C shows a potential diagram of FIG. 5A along line 104 during charge transfer when the transfer gate is turned on.

DETAILED DESCRIPTION OF THE INVENTION

Figure 1A:
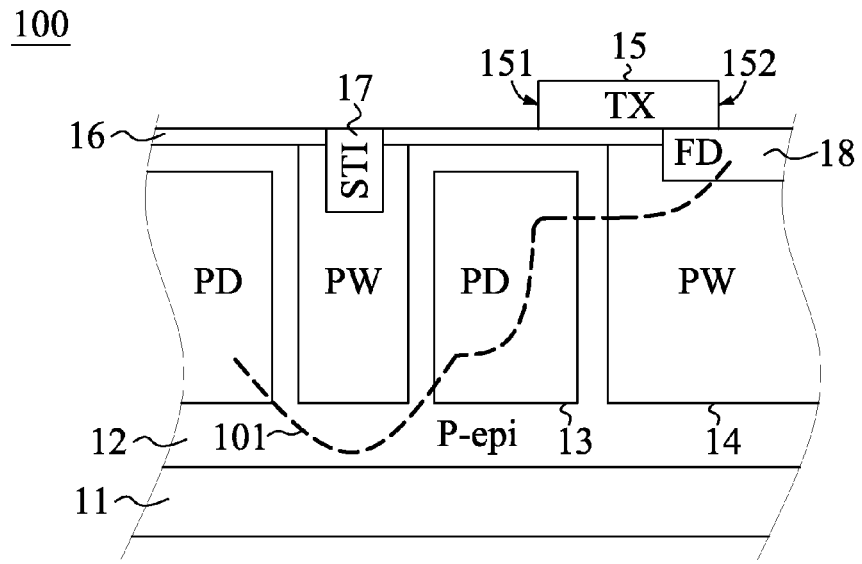
FIG. 1A shows a cross sectional view of a complementary metal-oxide-semiconductor (CMOS) image sensor.
Figure 1B:
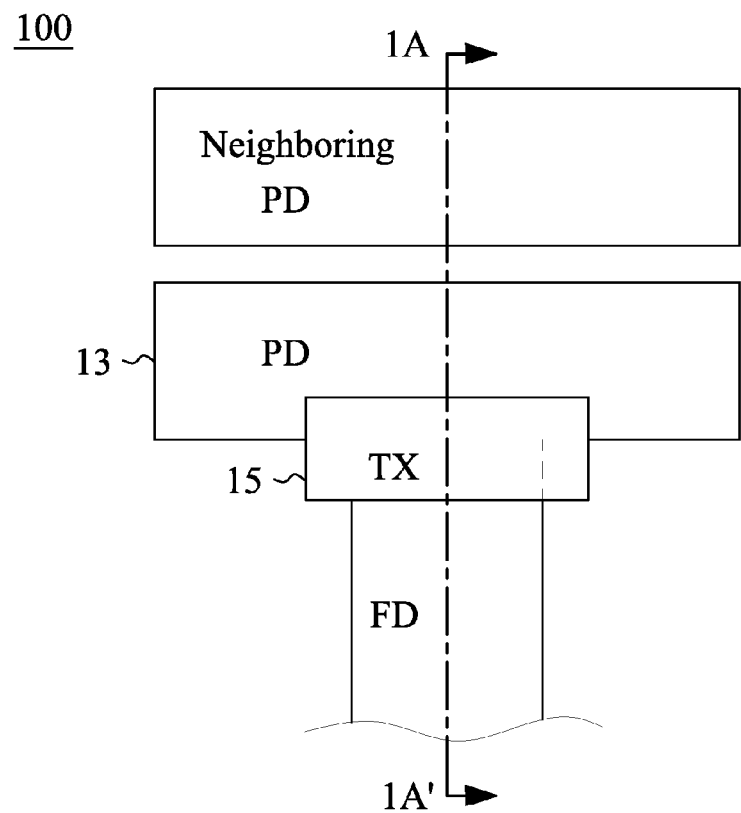
FIG. 1B shows a top view of the CMOS image sensor of FIG. 1A.

FIG. 1A shows a cross sectional view of a complementary metal-oxide-semiconductor (CMOS) image sensor 100. FIG. 1B shows a top view of the CMOS image sensor 100 of FIG. 1A, depicting a section line 1A-1A' along which the cross sectional view of FIG. 1A is obtained. The CMOS image sensor 100 may primarily include a substrate 11 of a first type (e.g., P type). The CMOS image sensor 100 may include a crystalline layer 12 of the first type, such as a P-type epitaxial layer or P-epi, formed on the substrate 11. The CMOS image sensor 100 may also include a photodiode (PD) 13 and at least one doped well 14 of the first type (e.g., P-type well or PW) formed in the crystalline layer 12. The CMOS image sensor 100 may further include a transfer gate (Tx) 15 that includes a gate oxide layer disposed on the top surface of the crystalline layer 12. The transfer gate 15 is formed on a top surface of the crystalline layer 12 and partially covers an edge of the photodiode 13 and an edge of the doped well 14. In the top portion of the crystalline layer 12 is formed a transfer gate channel implant 16. Specifically, the transfer gate channel implant 16 is over all area of the photodiode 13 and is partially under the transfer gate 15. The portion under the transfer gate 15 is channel adjustment implant for dark current and charge transfer, and the portion over the photodiode 13 serves as a surface pinning layer for the photodiode 13. An isolation region 17 such as shallow trench isolation (STI) is formed between neighboring pixels of the CMOS image sensor 100. As shown in FIG. 1A/1B, a floating diffusion (FD) node of a second type (e.g., N type) 18 is positioned in the doped well 14 and is partially covered by the transfer gate 15. To be more specific, the transfer gate 15 covers the photodiode 13 at a first end 151, and covers the floating diffusion node 18 at a second end 152.

Figure 1C:
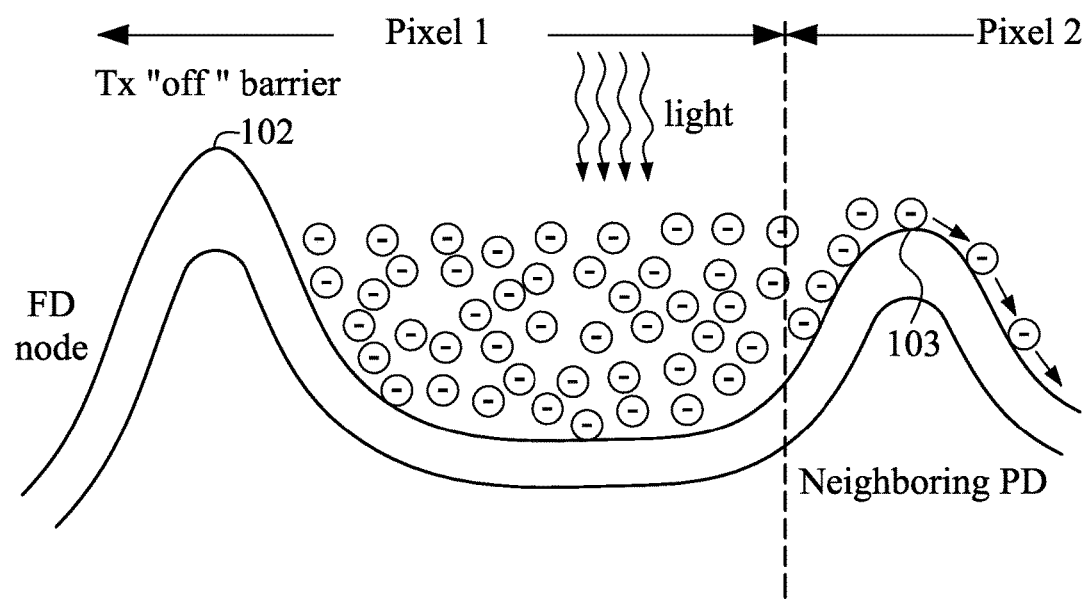
FIG. 1C shows a potential diagram of FIG. 1A along line 101 during light exposure when the transfer gate is turned off.

FIG. 1C shows a potential diagram along a (dotted) cutting line 101 of FIG. 1A during light exposure when the transfer gate 15 is turned off. As shown in FIG. 1C, a barrier 102 situated between the photodiode 13 and the doped well 14 is higher than another barrier 103 near the isolation region 17 between neighboring pixels. When full well saturation is reached at strong light, extra photo electrons will flow out of the photodiode 13 via the lower barrier 103 into neighboring non-saturated pixel, therefore resulting in blooming.

Figure 2A:
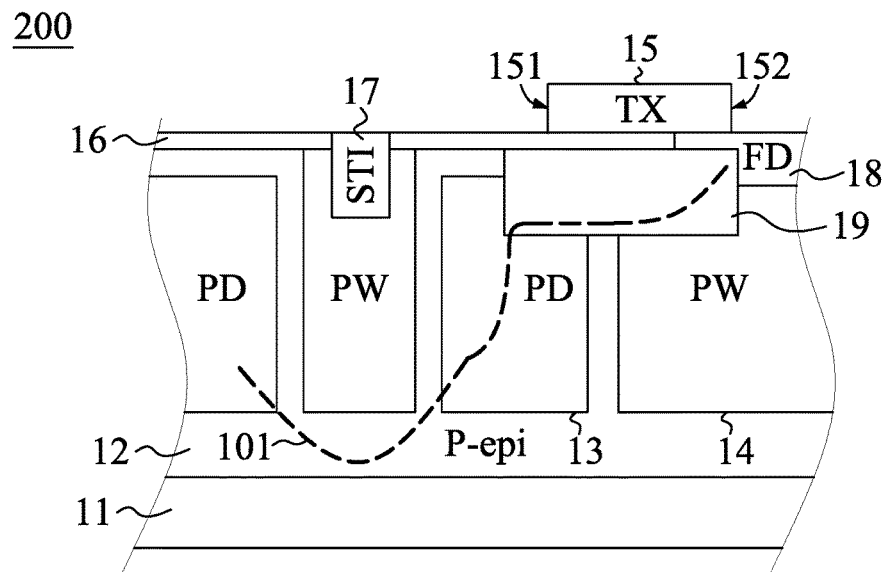
FIG. 2A shows a cross sectional view of a CMOS image sensor according to one embodiment of the present invention.
Figure 2B:
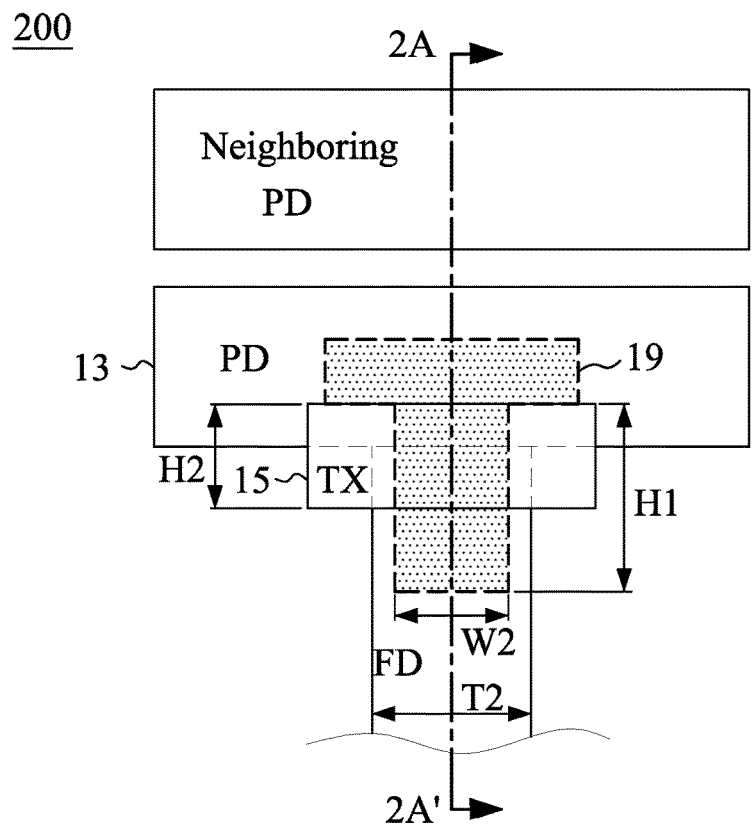
FIG. 2B shows a top view of the CMOS image sensor of FIG. 2A.

In order to prevent blooming (i.e., anti-blooming), a novel structure is proposed. FIG. 2A shows a cross sectional view of a CMOS image sensor 200 according to one embodiment of the present invention. The CMOS image sensor 200 of the embodiment is capable of improving anti-blooming when the transfer gate 15 is turned off during an exposure phase. It is appreciated that the CMOS image sensor 200 of the embodiment may be adapted to a front side illumination (FSI) CMOS image sensor, and may be adapted to a back side illumination (BSI) CMOS image sensor as well. FIG. 2B shows a top view of the CMOS image sensor 200 of FIG. 2A, depicting a section line 2A-2A' along which the cross sectional view of FIG. 2A is obtained. In addition to the components of FIG. 1A/1B as described above, the CMOS image sensor 200 of FIG. 2A/2B may further include an implant region 19 of the second type (e.g., N type) opposite to the first type formed in the crystalline layer 12 and is partially disposed in (and joins) the photodiode 13, the doped well 14 and the floating diffusion node 18. The implant region 19 of the embodiment is partially covered by the transfer gate 15, but is entirely covered by a channel (i.e., the lateral width H2 in FIG. 2B) of the transfer gate 15.

Figure 2C:
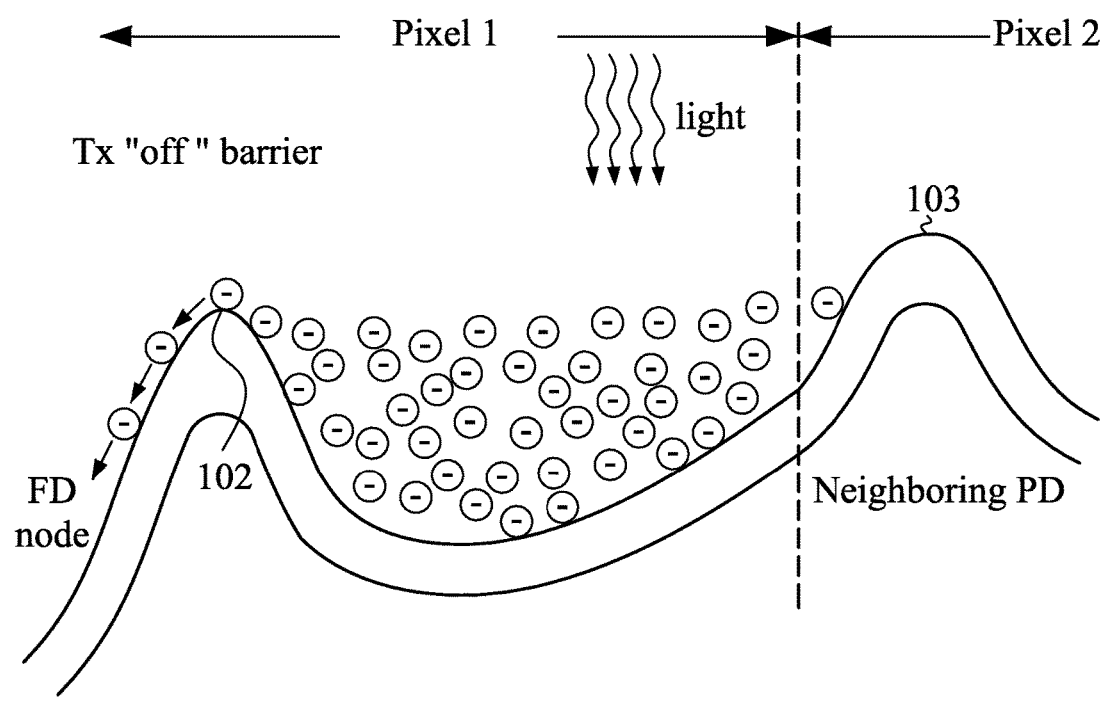
FIG. 2C shows a potential diagram of FIG. 2A along line 101 during light exposure when the transfer gate is turned off.

FIG. 2C shows a potential diagram along a (dotted) cutting line 101 of FIG. 2A during light exposure when the transfer gate is turned off. As shown in FIG. 2C, the barrier 102 situated between the photodiode 13 and the doped well 14 is lowered due to the implant region 19 that weakens the original P type doping of the doped well 14 in the same region. When full well saturation is reached at strong light, extra photo electrons will flow via the barrier 102 and are drained by the floating diffusion node 18 which is positively biased during the exposure phase, therefore improving anti-blooming.

In the embodiment, with proper implant dosage and energy, the implant region 19 may be positioned with a specified distance away from the top surface of the crystalline layer 12. The implant region 19 does not touch the transfer gate channel implant 16 except where the implant region 19 joins the floating diffusion node 18 at the second end 152 of the transfer gate 15, where the transfer gate channel implant 16 dark current no longer flows back to the photodiode 13 but to the floating diffusion node 18. Therefore, it will not affect much the high holes accumulation condition at the portion of the transfer gate channel implant 16 close to the photodiode 13, therefore minimizing dark current degradation. On the other side, the doped well 14 below the floating diffusion node 18 may be properly adjusted so that the implant region 19 can extend, deeper to the crystalline layer 12 to enlarge the anti-blooming path. To be more specific, the implant region 19 and the transfer gate channel implant 16 are very close to each other. After thermal cycle of entire process, they must interact at their boundaries. The distance between the implant region 19 and the transfer gate channel implant 16 is a trade-off. Closer benefits charge transfer but degrades dark current, and further is good for dark current but not for charge transfer.

Figure 3A:
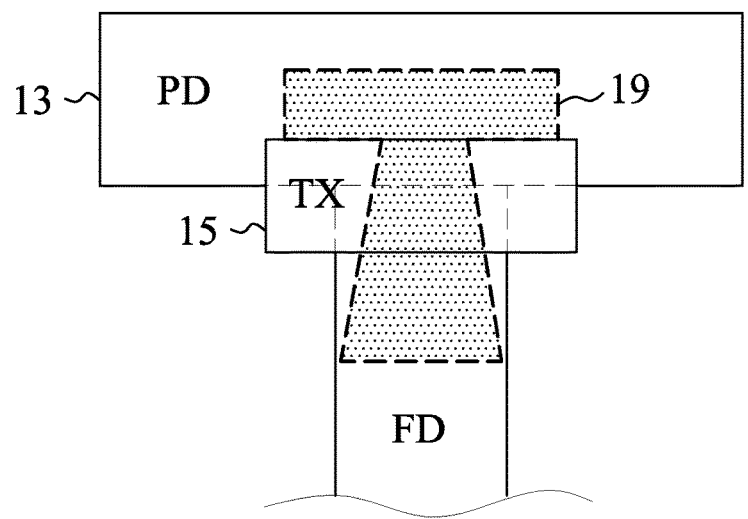
FIG. 3A and FIG. 3B show top views of the CMOS image sensor of FIG. 2A with alternative mask patterns of the implant region.
Figure 3B:
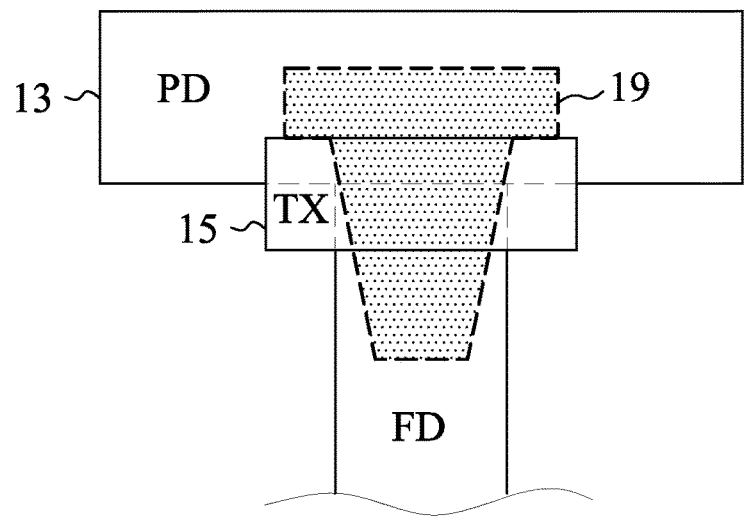

In consideration of area profile of the implant region 19, referring to FIG. 2B, a mask shape requirement T2>W2 can enlarge anti-blooming path but leave some distance away from the side wall of STI of Tx channel, where T2 is defined as the STI side wall distance inside the channel of the transfer gate 15. Another mask shape requirement H1>H2 can push the saddle point of anti-blooming potential barrier lower and its position closer to the photodiode 13, such that the dark current will flow to the floating diffusion node 18 but not the photodiode 13, and the anti-blooming strength can be enhanced as well. FIG. 3A and FIG. 3B show top views of the CMOS image sensor 200 of FIG. 2A with alternative mask patterns of the implant region 19. Specifically, a part of the implant region 19 has a tapered shape with a width being gradually thicker away from the photodiode 13 (FIG. 3A), or being gradually thinner away from the photodiode 13 (FIG. 3B). They are alternative ways to the implant region 19 patterns that can adjust the trade-off between dark current vs. Anti-blooming & charge transfer.

Figure 4A:
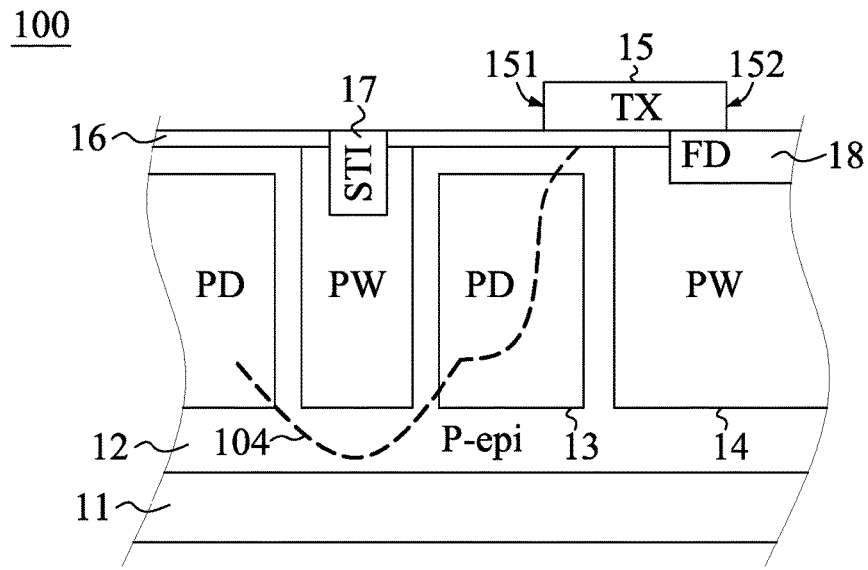
FIG. 4A shows a cross sectional view of the CMOS image sensor of FIG. 1A.
Figure 4B:
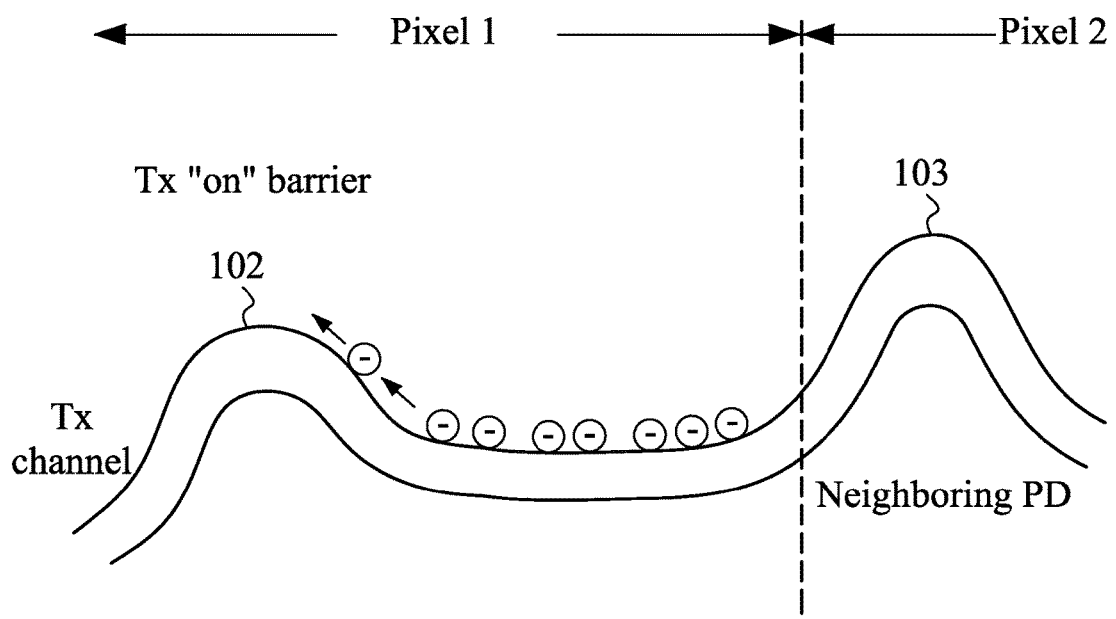

FIG. 4A shows a cross sectional view of the CMOS image sensor 100 (similar to that shown in FIG. 1A), and FIG. 4B shows a potential diagram along a (dotted) cutting line 104 of FIG. 4A when the transfer gate 15 is turned on during charge transfer. The CMOS image sensor 100 of FIG. 4A suffers from slow charge transfer.

Figure 5A:
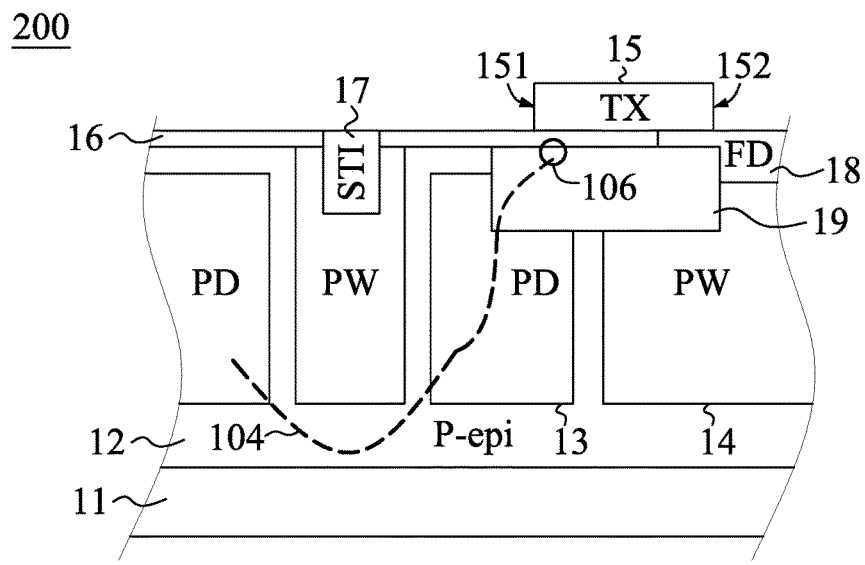
FIG. 5A shows a cross sectional view of the CMOS image sensor of FIG. 2A.
Figure 5B:
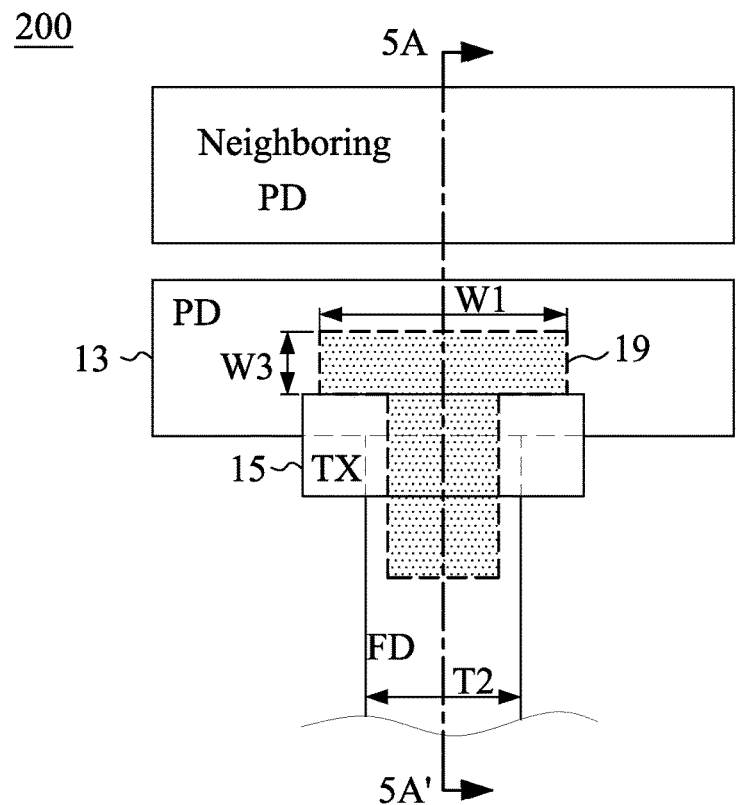
FIG. 5B shows a top view of the CMOS image sensor of FIG. 5A.
Figure 5C:
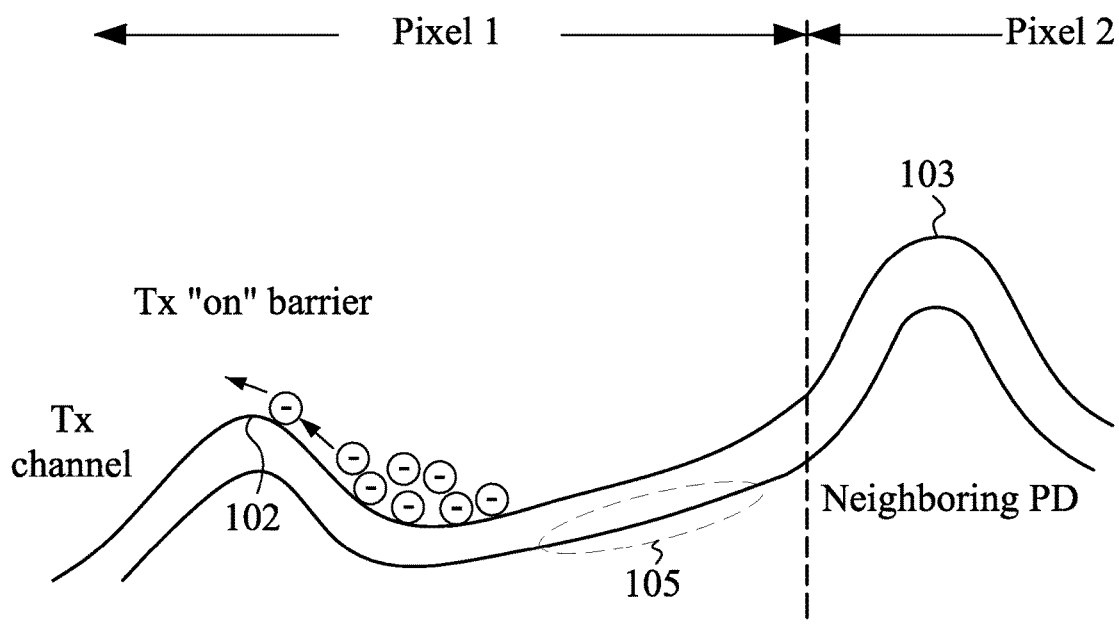

The CMOS image sensor 200 of the embodiment can improve charge transfer when the transfer gate 15 is turned on during charge transfer. FIG. 5A shows a cross sectional view of the CMOS image sensor 200 (similar to that shown in FIG. 2A); FIG. 5B shows a top view of the CMOS image sensor 200 of FIG. 5A, depicting a section line 5A-5A' along which the cross sectional view of FIG. 5A is obtained; and FIG. 5C shows a potential diagram along a (dotted) cutting line 104 of FIG. 5A when the transfer gate 15 is turned on during charge transfer.

It is noted that charge transfer is mainly limited by two factors: (1) transient time of charges that determines how fast the photo carriers in the photodiode 13 travel to Tx entrance; (2) magnitude of the Tx "on" barrier 102 at the Tx entrance that the photo carriers have to surmount.

In the embodiment, the implant region 19 only partially covers the photodiode 13 at the first end 151 of the transfer gate 15. The photo carriers generated in far corners of the photodiode 13 will be accelerated by generated enhanced potential gradient 105, thus quickly running to Tx entrance. Some mask shape requirements are W1>T2 and W3=30-40% of photodiode 13 size along that dimension. According to the requirements, the lowest electron potential point is at the vicinity of Tx entrance. There are no other potential pockets inside the photodiode 13. The potential gradient 105 is roughly distributed evenly from any path from a far end point of the photodiode 13 to the lowest potential pocket, therefore avoiding flat potential or zero potential gradient regions. Accordingly, transient time of charges can be cut.

As to the Tx "on" barrier 102, the implant region 19 of the embodiment offers the following improvements: (1) lower Tx "on" barrier 102 by reducing P type doping at the Tx entrance region; (2) vertically extend the Tx "on" barrier saddle point 106 width into the bulk crystalline layer 12; and (3) laterally enlarge the Tx "on" barrier saddle point 106 overlapping to Tx channel, where the charge transfer current is enhanced by a larger size of the saddle point 106. Accordingly, the Tx "on" barrier 102 at the Tx entrance can be further optimized, thus charge transfer can be improved when the transfer gate 15 is turned on during a shutter off phase.

FIG. 6A to FIG. 6H show cross sectional views illustrated a flow of forming the CMOS image sensor 200 according to one embodiment of the present invention. It is appreciated that only steps pertinent to the embodiment are illustrated.

Figure 6A:
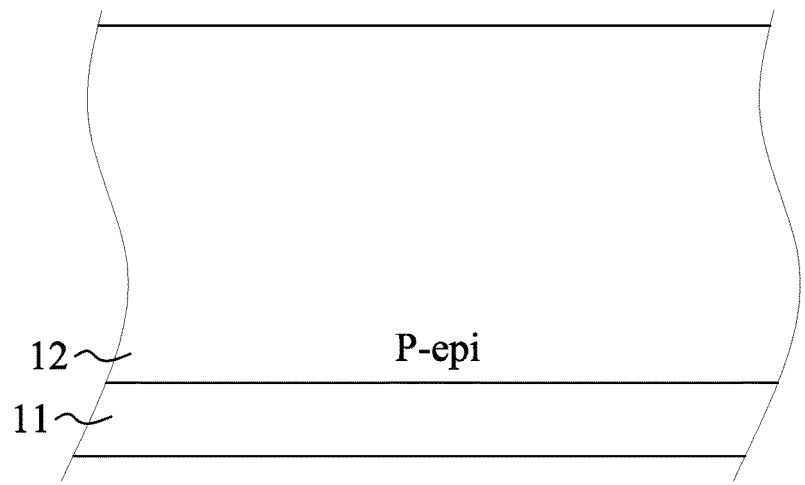
FIG. 6A to FIG. 6H show cross sectional views illustrated a flow of forming the CMOS image sensor according to one embodiment of the present invention.

First, in FIG. 6A, a substrate 11 (e.g., silicon) of a first type (e.g., P type) is provided. A crystalline layer 12 of the first type, such as a P-type epitaxial layer, is formed on the substrate 11.

Figure 6B:
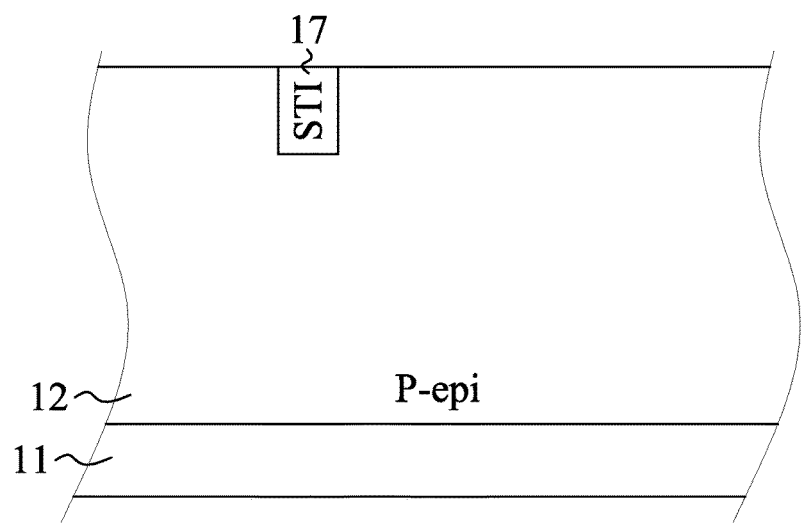
Figure 6C:
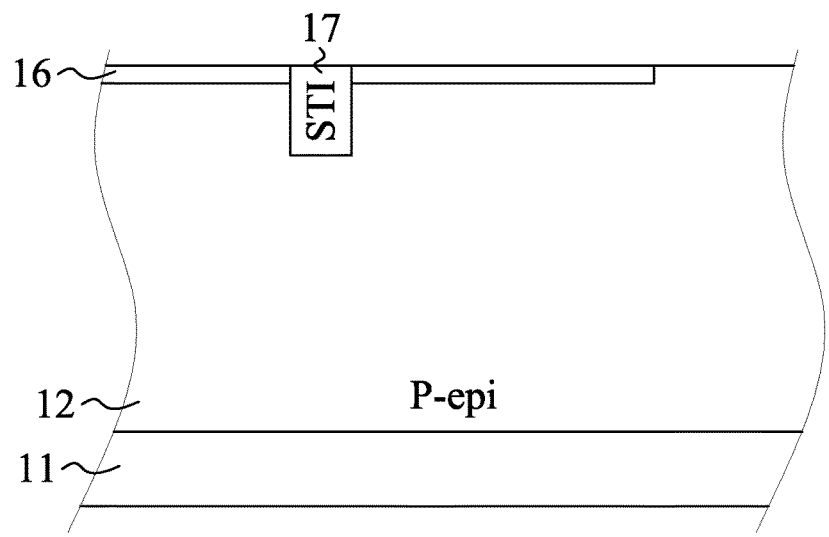
Figure 6D:
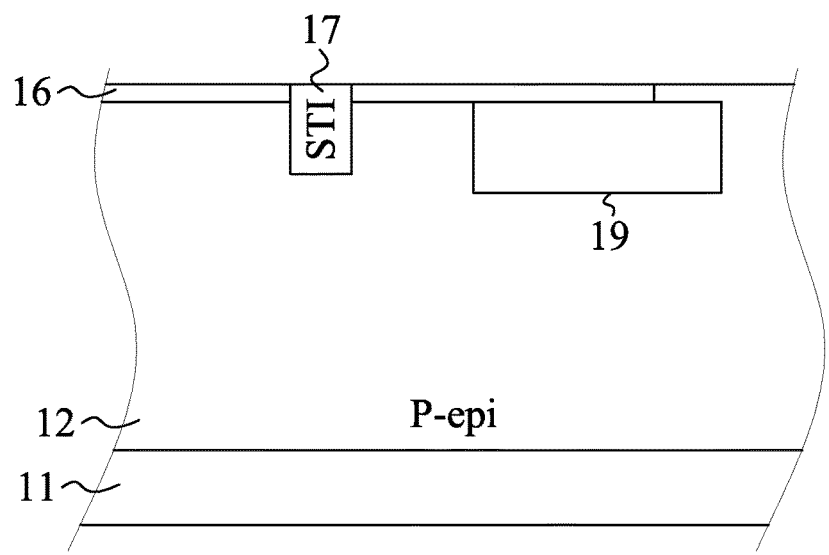

Next, in FIG. 6B, an isolation region 17 such as shallow trench isolation (STI) is formed between neighboring pixels of the CMOS image sensor 200. Subsequently, in FIG. 6C, a transfer gate channel implant 16 is formed in the top portion of the crystalline layer 12.

According to one aspect of the embodiment, an implant region 19 of a second type (e.g., N type) is formed in the crystalline layer 12. In one embodiment, the step illustrated in FIG. 6D for forming the implant region 19 may be performed in earlier process stage up to wafer start to get a sufficient thermal treatment for an optimal implant profile and implant damage healing by anneal.

Figure 6E:
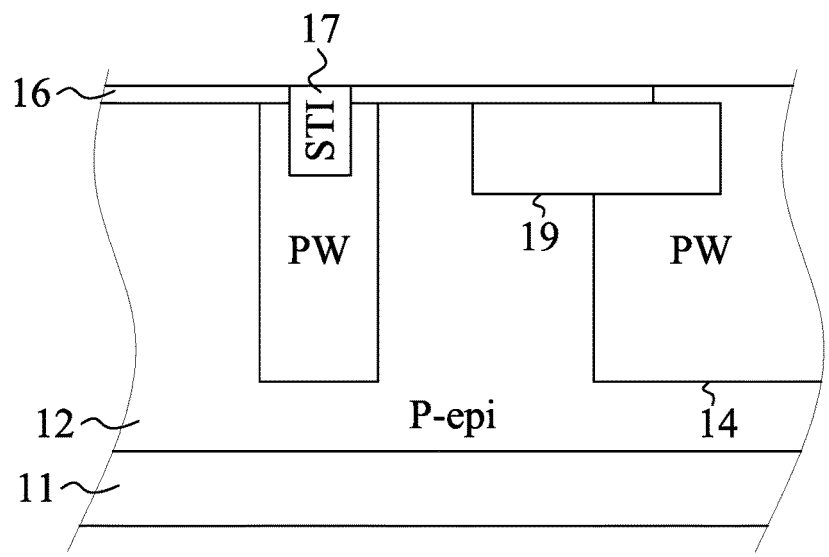

Thereafter, in FIG. 6E, at least one doped well 14 of the first type is formed in the crystalline layer 12. The implant region 19 is partially disposed in (and joins) the doped well 14. It is appreciated that the steps illustrated in FIG. 6C to FIG. 6E could be interchangeable if they are all in the subsequent steps of 6B.

Figure 6F:
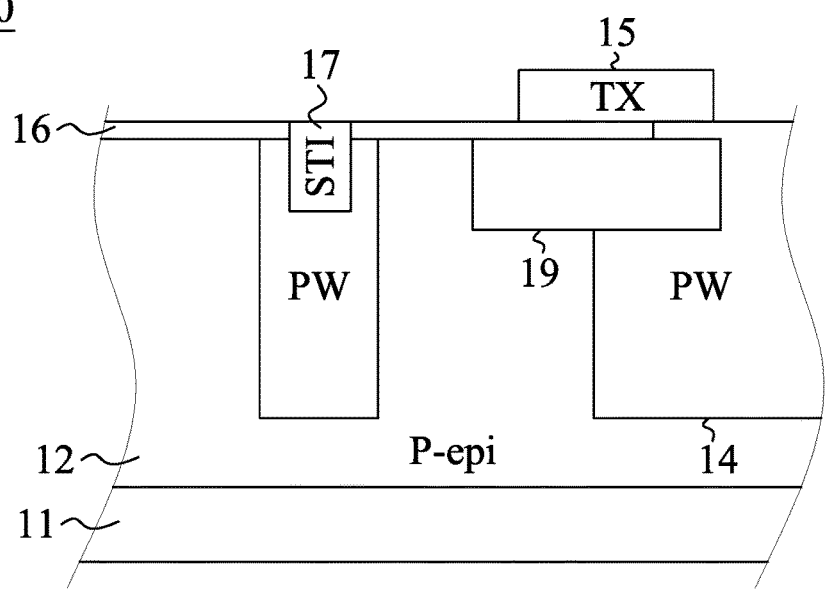

In FIG. 6F, a transfer gate (Tx) 15 is formed on a top surface of the crystalline layer 12 and partially covers an edge of the doped well 14. A channel (i.e., the lateral width) of the transfer gate 15 entirely covers the implant region 19. It is noted that the implant region 19 (FIG. 6D) is formed before the transfer gate 15 (FIG. 6F) is formed.

Figure 6G:
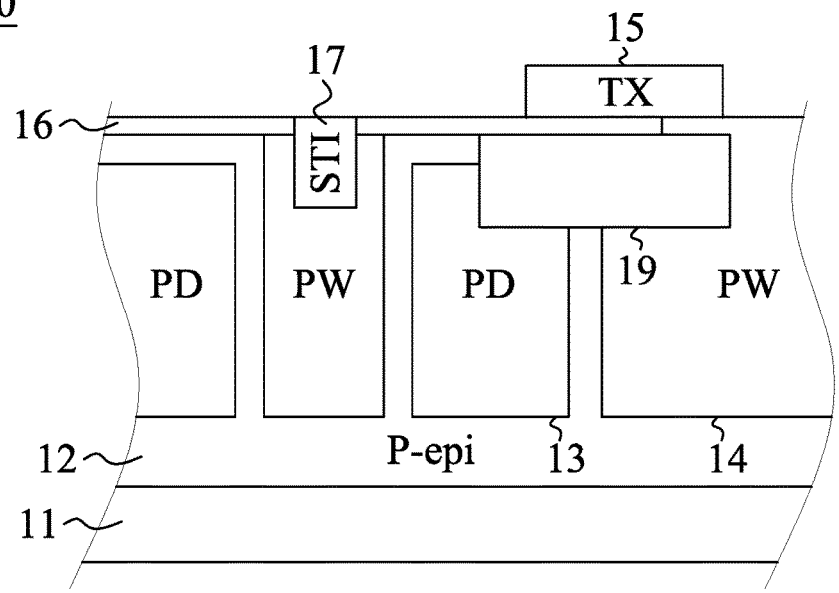

In FIG. 6G, a photodiode (PD) 13 is formed in the crystalline layer 12, and an edge of the photodiode 13 is partially covered by the transfer gate 15. The implant region 19 is partially disposed in (and joins) the photodiode 13.

Figure 6H:
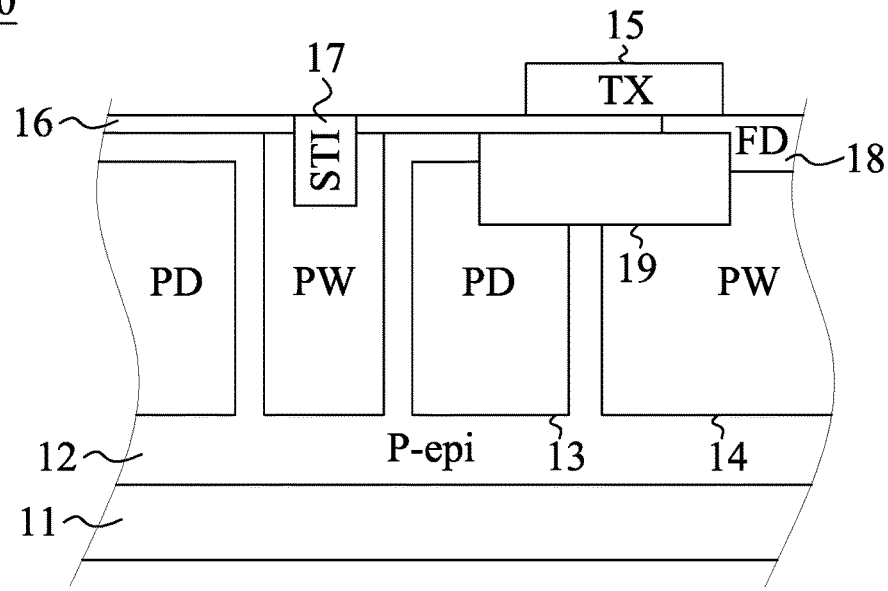

Afterwards, in FIG. 6H, source/drain implant is performed to result in a floating diffusion (FD) node 18 positioned in the doped well 14 and is partially covered by the transfer gate 15. The implant region 19 is partially disposed in (and joins) the floating diffusion node 18.

Although specific embodiments have been illustrated and described, it will be appreciated by those skilled in the art that various modifications may be made without departing from the scope of the present invention, which is intended to be limited solely by the appended claims.

What is claimed is:

1. A complementary metal-oxide-semiconductor (CMOS) image sensor, comprising:
   a substrate;
   a crystalline layer of a first type formed on the substrate;
   a photodiode formed in the crystalline layer;
   at least one doped well of the first type formed in the crystalline layer;
   a transfer gate formed on a top surface of the crystalline layer, the transfer gate partially covering an edge of the photodiode and an edge of the doped well;
   a floating diffusion node positioned in the doped well; and
   an implant region of a second type formed in the crystalline layer, the implant region partially joining the photodiode, the doped well and the floating diffusion node, and being entirely covered by a channel of the transfer gate.

2. The CMOS image sensor of claim 1, further comprising a transfer gate channel implant formed in a top portion of the crystalline layer.

3. The CMOS image sensor of claim 1, wherein the floating diffusion node is partially covered by the transfer gate.

4. The CMOS image sensor of claim 1 comprises a front side illumination (FSI) CMOS image sensor or a back side illumination (BSI) CMOS image sensor.

5. The CMOS image sensor of claim 1, wherein the implant region is positioned with a specified distance away from the top surface of the crystalline layer.

6. The CMOS image sensor of claim 1, wherein the implant region does not touch the channel of the transfer gate except where the implant region joins the floating diffusion node.

7. The CMOS image sensor of claim 1, wherein a part of the implant region has a tapered shape with a width being gradually changed away from the photodiode.

8. The CMOS image sensor of claim 1, further comprising an isolation region formed between neighboring pixels.

9. The CMOS image sensor of claim 8, wherein the isolation region comprises shallow trench isolation.

\* \* \* \* \*